(12) United States Patent
Cho et al.

(10) Patent No.: US 9,064,555 B2
(45) Date of Patent: Jun. 23, 2015

(54) SECONDARY BIT LINE EQUALIZER

(71) Applicant: ORACLE INTERNATIONAL CORPORATION, Redwood Shores, CA (US)

(72) Inventors: Hoyeol Cho, Palo Alto, CA (US); Ioannis Orginos, Sunnyvale, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 318 days.

(21) Appl. No.: 13/684,897

(22) Filed: Nov. 26, 2012

(65) Prior Publication Data
US 2014/0146627 A1    May 29, 2014

(51) Int. Cl.
  *G11C 7/00*  (2006.01)
  *G11C 7/12*  (2006.01)

(52) U.S. Cl.
  CPC .................................. *G11C 7/12* (2013.01)

(58) Field of Classification Search
  USPC .................. 365/203, 189.14, 189.06, 189.15, 365/189.16
  See application file for complete search history.

(56) References Cited

U.S. PATENT DOCUMENTS

| | | | |
|---|---|---|---|
| 5,426,610 A * | 6/1995 | Childers et al. ............... | 365/205 |
| 5,717,645 A | 2/1998 | Kengeri et al. | |
| 6,154,400 A | 11/2000 | Wang et al. | |
| 6,275,435 B1 * | 8/2001 | Su et al. ........................ | 365/207 |
| 6,631,093 B2 | 10/2003 | Kumar et al. | |
| 6,928,012 B2 | 8/2005 | Camacho et al. | |
| 7,218,564 B2 | 5/2007 | Faue et al. | |
| 7,474,549 B2 | 1/2009 | Chang et al. | |
| 2004/0264272 A1 | 12/2004 | Demone | |

FOREIGN PATENT DOCUMENTS

KR    2003002236 A    1/2003

OTHER PUBLICATIONS

Patel et al; Minimizing Power Dissipation during Write Operation to Register Files; ISLPED'07, Aug. 27-29, 2007, Portland, Oregon; pp. 1-6.

* cited by examiner

*Primary Examiner* — Son Dinh
(74) *Attorney, Agent, or Firm* — Kraguljac Law Group, LLC

(57) ABSTRACT

Systems, methods, and other embodiments associated with bit line equalization are described. Systems and methods described herein provide secondary bit line equalization for embedded memory systems to reduce equalization time and improve memory performance. The reduction in equalization time is accomplished by adding a secondary equalizer in addition to a standard primary equalizer for a column of memory cells.

19 Claims, 7 Drawing Sheets

SECONDARY BIT LINE EQUALIZER

BACKGROUND

Many electronic devices and systems include integrated circuits for the storage of data during the operation of the devices. For example, electronic devices such as computers, printing devices, scanning devices, personal digital assistants, calculators, computer work stations, audio and/or video devices, communications devices such as cellular telephones, and routers for packet switched networks may include memory in the form of integrated circuits for retaining data as part of their operation. Advantages of using integrated circuit or embedded memory compared to other forms of memory include space conservation and miniaturization, conservation of limited battery resources, decreased access time to data stored in the memory, and cutting the costs of assembling the electronic devices.

Dynamic Random Access Memory (DRAM) and Static Random Access Memory (SRAM) are examples of integrated circuited memory. DRAM and SRAM typically comprise an array of semiconductor capacitor memory cells, each of which hold an amount of electric charge that represents the logical value of a stored bit. The memory cells in the array are typically arranged in rows and columns. Each memory cell is situated at the intersection of a row and a column. Each memory cell in the array may be accessed by simultaneously addressing the intersecting row and column.

In operation, internal sense amplifiers in the embedded memory sense the amounts of electric charges stored on the capacitive memory cells. Based on the sensed electric charges, the outputs of the sense amplifiers represent the logical values of the bits that are stored in the memory array. In this manner, the data stored the array may be extracted from the embedded memory for use by other circuits. In addition, other circuits may store logical values of bits in the memory array by way of an internal memory write driver that is capable of charging or discharging memory cells.

The sense amplifiers and write driver connect to the memory cells through bit line pairs, a bit line and a complementary bit line, which comprise the columns of the embedded memory. Before reading or writing to a cell, residual charge on the bit line pair that addresses the cell is removed. The residual charge is the remnant of a prior read or write operation on the bit line pair. In general, more residual charge is present on the bit line pair after a write operation as compared to after a read operation. This is because a read operation only partially charges/discharges the bit line pair, to a minimal charge level that still allows a distinction between a one bit and a zero bit, while the write operation more fully charges/discharges the bit line pair.

The residual charge is removed by precharging the bit line pair to a common potential before performing the read or write operation. FIG. 1A illustrates a conventional way in which precharge time is defined. The bit line (bl_t) and the complementary bit line (bl_c) begin precharging when a recovery signal (blrec) reaches 50% of a supply voltage $V_{dd}$. The precharge time ends when both the bit line and the complementary bit line reach a predetermined percent (e.g., a percent) of $V_{dd}$.

The charge on the bit line and the complementary bit line are also equalized so that they are close in charge level. FIG. 1B illustrates a conventional way in which equalization time is measured. The equalization time starts when the recovery signal (blrec) reaches 50% of the supply voltage $V_{dd}$. The equalization time ends when the bit line and the complementary bit line are within a predetermined differential voltage $\Delta V$.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Systems and methods are described herein that provide secondary bit line equalization for embedded memory systems to reduce equalization time and improve memory performance. The reduction in equalization time is accomplished by adding a secondary equalizer in addition to a standard primary equalizer for a column of memory cells, as described in more detail below.

In embedded memory design as the operating frequency increases, it becomes increasingly difficult to read and write bits to the memory within the allowed cycle time. The difficulty is compounded when the memory cells are made smaller and provide lower charging currents while the parasitic RC circuit caused by wires in the memory is not scaled proportionately to memory cell size. Even in cases when the bit line has a large loading due to large array size, the memory array is typically not split due to area constraints. All of these factors negatively affect the speed with which the residual charge can be removed from the bit line pair, as measured by the precharge time and the equalization time, and in turn increase the read/write operation latency for the embedded memory.

Figure 1A:
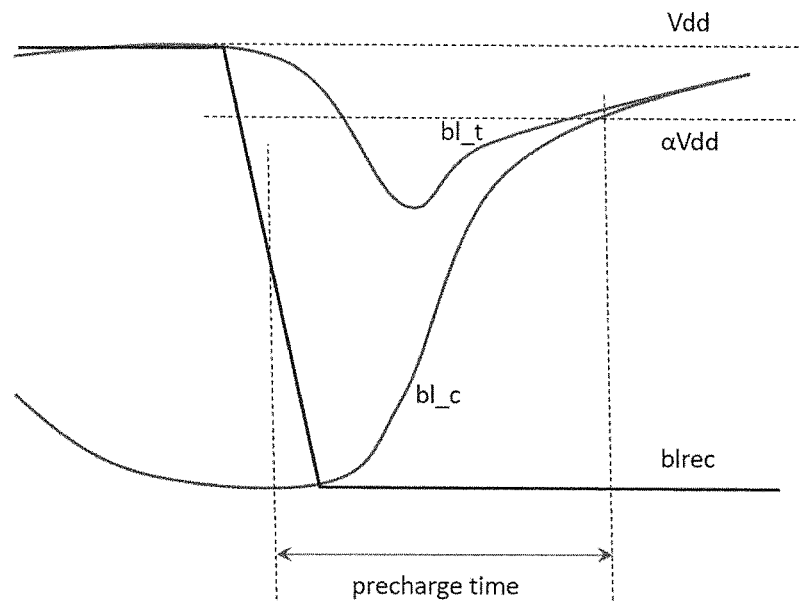
FIGS. 1A and 1B are plots of bit line charge level defining precharge time and equalization time for embedded memory systems.
Figure 1B:
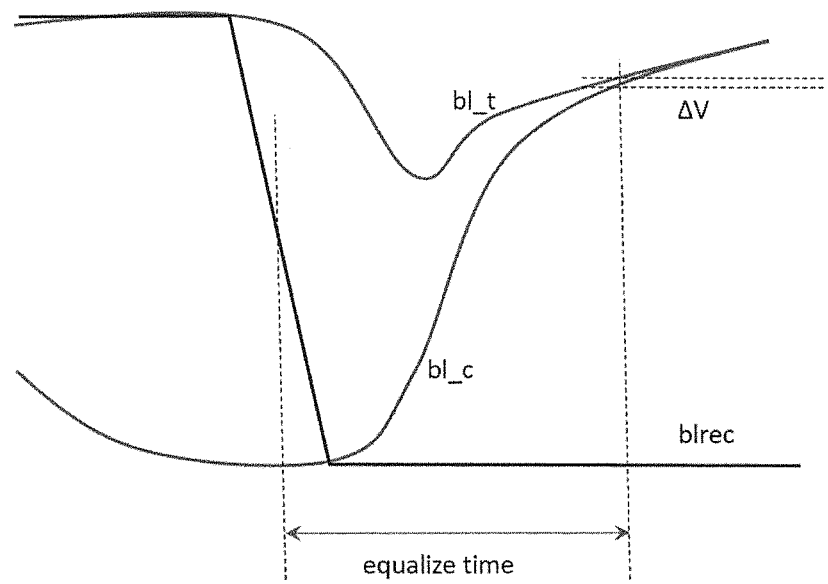
Figure 2:
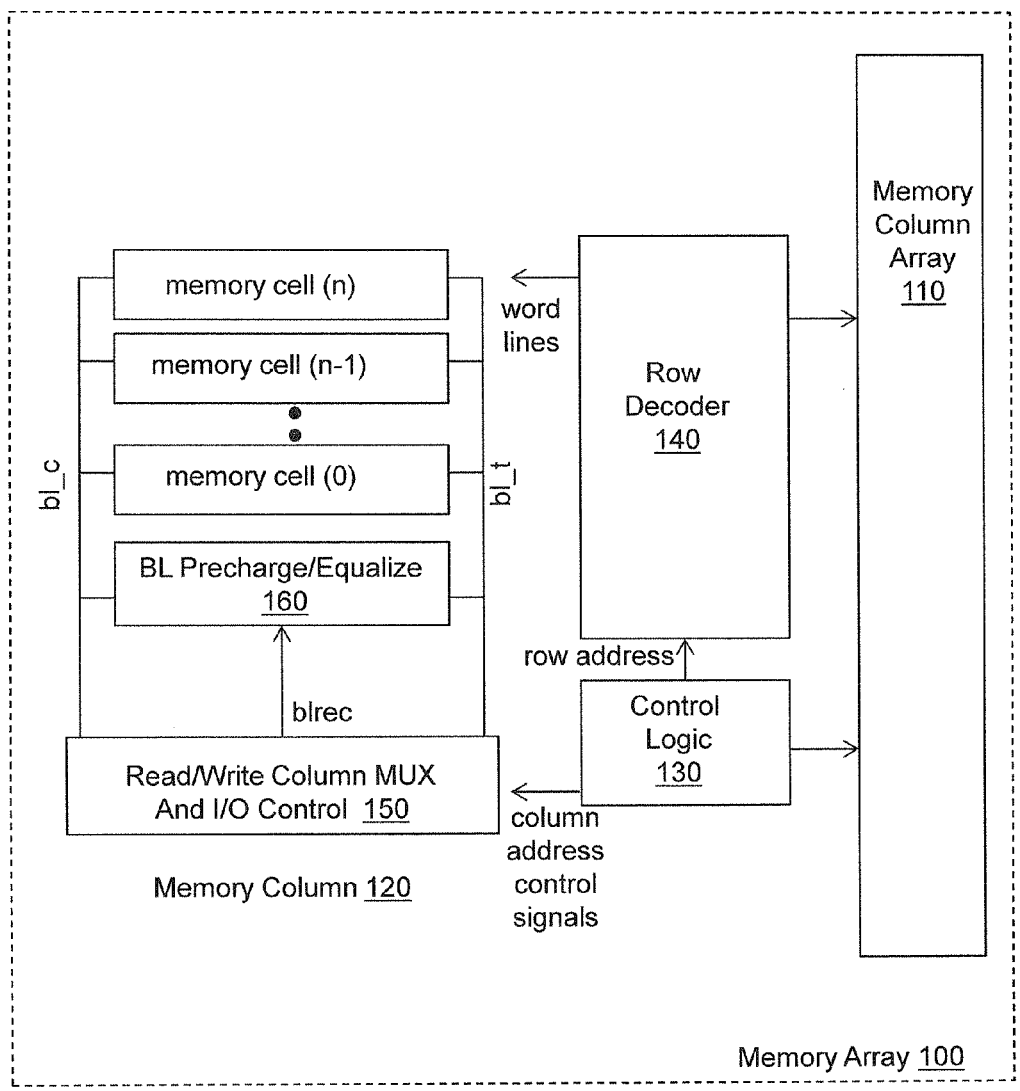
FIG. 2 illustrates an embedded memory system with a single precharge/equalize circuit.

FIG. 2 illustrates a block diagram of an embedded memory array 100 (e.g. DRAM or SRAM) that includes a single bit line precharge/equalizer circuit 160. The embedded memory array 100 includes a memory column 120 that includes memory cells 0-n connected between a bit line pair. The bit line pair includes two bit lines: bl_t (referred to as the bit line or the "true" bit line) and bl_c (referred to as the complementary bit line). A word line that selects a row of memory cells is driven by a row decoder 140 that decodes a row address provided by a control logic 130. The bit line pair is charged by a selected memory cell during a read operation. During a write operation, the bit line pair is charged by a write driver (not shown) through a column select multiplexer 150 that decodes column addresses.

The bit line pair is connected to many memory cells, hence the bit line pair experiences significant capacitive loading and resistance due to wire and junctions of a pass gate inside each memory cell (not shown). Because of the RC loading, the precharge/equalization time is increased and the read and write operations become a bottleneck in memory performance. It is difficult to mitigate the effects of the RC loading on the precharge/equalization time because newer embedded memories use a higher read current that improves performance but requires a higher precharge voltage. The time required to develop the higher voltage bit values on the bit line pair is increased due to the RC loading, meaning that the remaining voltage difference in the bit line pair will need to be overcome in the next read evaluation period.

Figure 4:
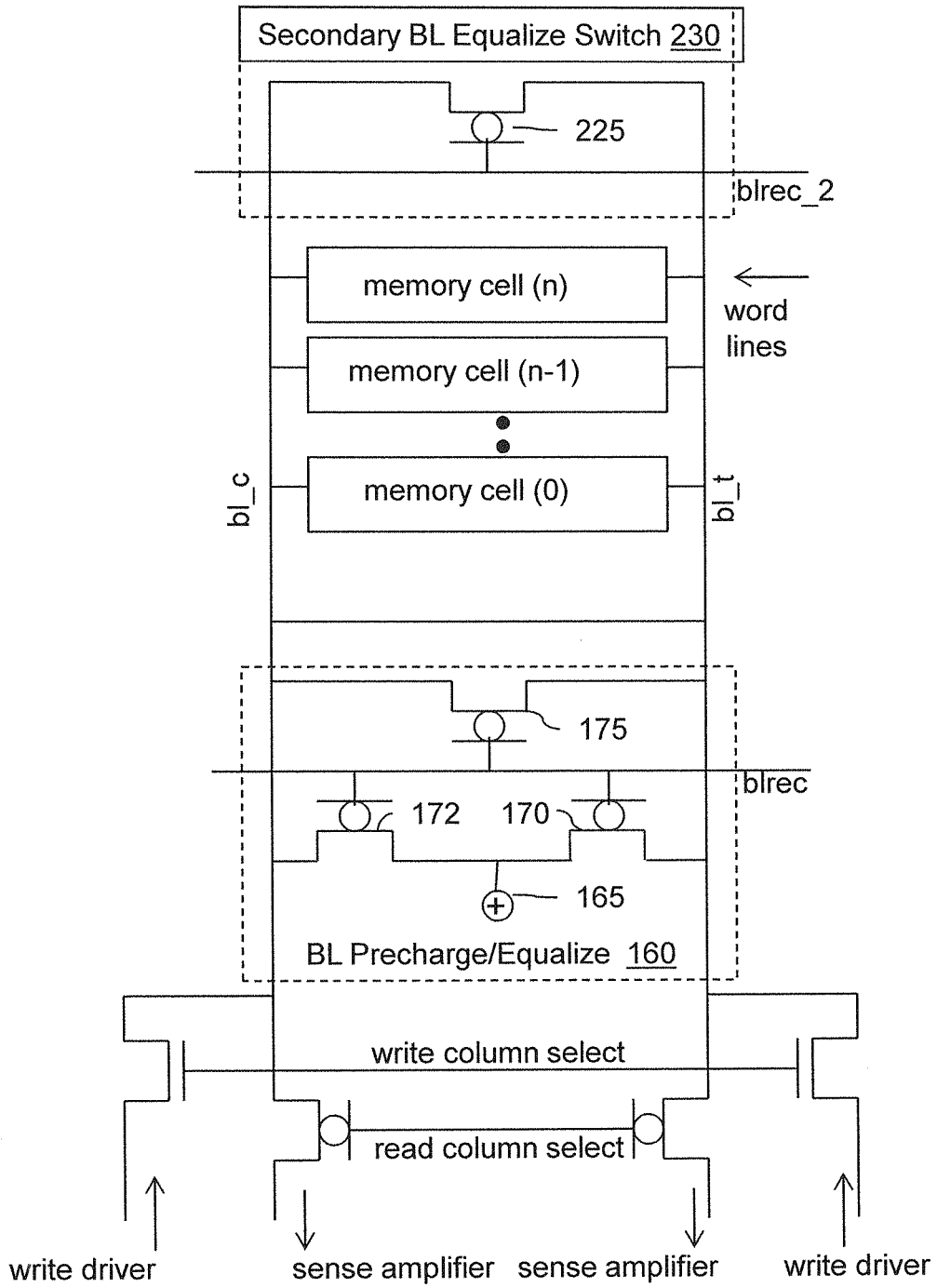
FIG. 4 illustrates one embodiment of an embedded memory system with secondary bit line equalizing.

To reduce the precharge/equalization times, the memory array 100 includes the precharge/equalize circuit 160, one embodiment of which is shown in more detail in FIG. 4. The precharge/equalize circuit 160 is triggered by a recovery signal, bl_rec, to electrically connect the bit lines to one another in series with a voltage source that drives the bit lines to the precharge voltage. The bl_rec signal is generated after each read and write operation, as shown in more detail in FIG. 5.

The precharge/equalize circuit 160 is located at the "bottom" of the memory column 120. Due to the RC effects of the memory column 120 discussed above, the memory cells at the top of the column (e.g., memory cells (n), N−1), and so on) will experience increased precharge/equalization times as compared to the memory cells that are located near the bottom of the column and thus are nearer to the precharge/equalize circuit 160.

Figure 3:
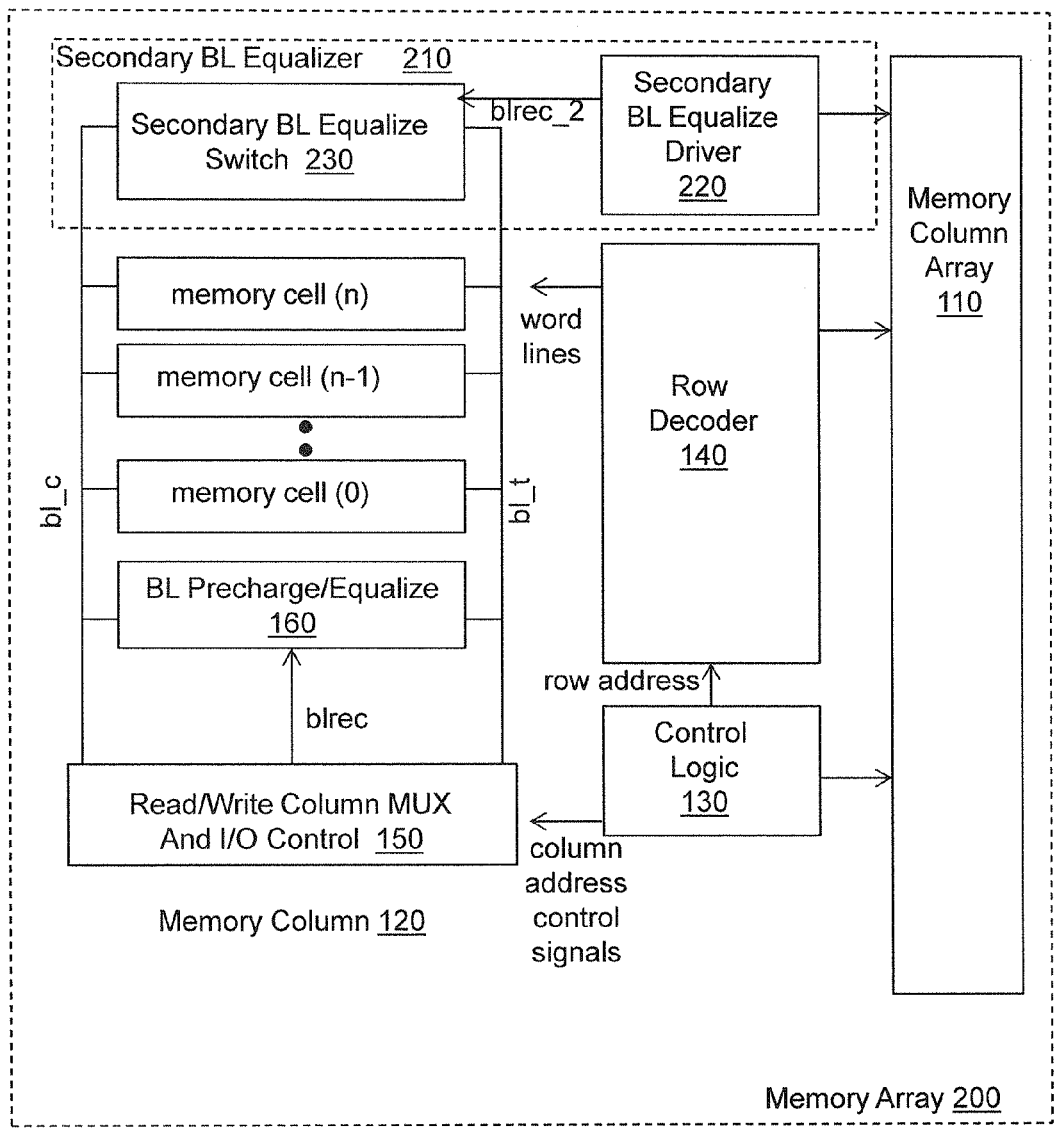
FIG. 3 illustrates one embodiment of an embedded memory system with secondary bit line equalizing.

FIG. 3 is a block diagram illustrating one example embodiment of a memory array 200 that includes a secondary bit line (BL) equalizer 210. The memory array 200 includes many of the same components as the memory array 100, which are labeled with the same reference numerals as in FIG. 2. The secondary bit line equalizer 210 includes a secondary bit line equalize driver 220 and a secondary bit line equalize switch 230. The secondary bit line equalize switch 230 is configured to electrically connect the bit line and the complementary bit line to one another in response to a trigger signal blrec_2 from the secondary bit line equalize driver 220. In one embodiment, the signal blrec_2 is generated independently of the recovery signal blrec and the two signals do not necessarily correlate to one another. As is shown in more detail below with respect to FIG. 5, in one embodiment, the secondary bit line equalize driver 220 generates the trigger signal blrec_2 based, at least in part, on a write enable signal the occurs when a write operation is performed on a memory cell in the column.

The secondary bit line equalize switch 230 is located at the "top" of the memory column 120, opposite the precharge/equalize circuit 160. The secondary bit line equalize switch 230 may be connected in a location that is proximate to the top of the column of memory. Additional secondary bit line equalize switches may be distributed throughout the memory column 120. The secondary bit line equalize switch 230 mitigates the RC loading effects of the memory column 120 by providing an additional equalization path for the bit lines at the top of the memory column 120, which are more distant from the precharge/equalize circuit 160.

FIG. 4 illustrates one example embodiment of the memory column 120 and provides more detail about the precharge/equalize circuit 160 and the secondary bit line equalize switch 230. The precharge/equalize circuit 160 includes a precharge component that includes first and second PMOS transistors 170, 172 and a voltage source 165. When the recovery signal blrec is present, the first and second PMOS transistors connect the bit line pair to the voltage source 165 so that a bit line that is below the voltage of the voltage source 165 is charged and a bit line that is above the voltage of the voltage source 165 drains into the voltage source 165.

The precharge/equalize circuit 160 includes an equalize component having a third PMOS transistor 175. When the recovery signal is present, the third PMOS transistor 175 electrically connects the bit line to the complementary bit line. This connection provides an equalization path by which the bit lines equalize their voltages. While three PMOS transistors are shown in the precharge/equalization circuit, other devices may be employed to achieve the same function.

The secondary bit line equalize switch 230 includes a single PMOS transistor 225. The PMOS transistor 225 is controlled by the trigger signal blrc_2 to selectively electrically connect the bit line to the complementary bit line. The secondary equalize switch 220 provides an additional equalization path for the top memory cells in the memory column 120. Other devices may be employed to achieve the same function as the secondary bit line equalize switch 220.

Use of a single PMOS transistor rather than the three PMOS transistors of the precharge/equalize circuit 160, reduces the area required by the secondary bit line equalize switch 220. While the addition of the secondary bit line equalize switch reduces equalization time, it does not affect precharge time. Equalization time is typically longer than precharge time, so reducing equalization time has a positive effect on the performance of the memory. Addition of the secondary bit line equalize switch 230 to the top of the memory column 120 reduces the effective RC loading to approximately one quarter of the effective RC loading of the memory column with the single precharge/equalize circuit. This reduction in effective RC loading results in a significant reduction in equalization time with only a minor impact on the area used by the memory column 120.

Figure 5:
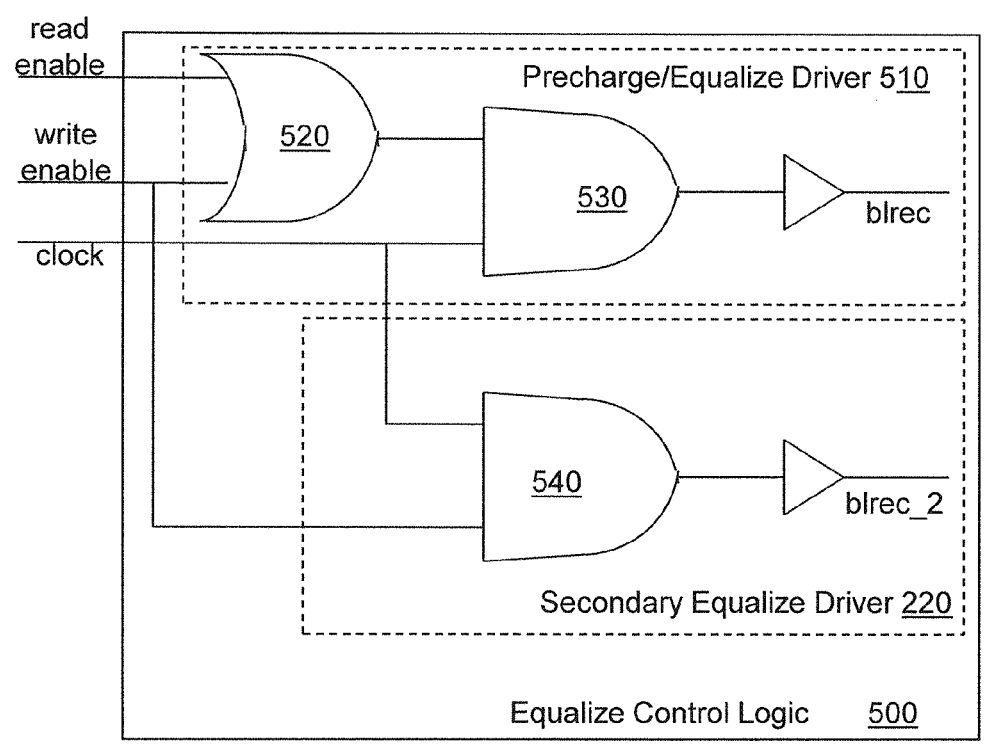
FIG. 5 is a logical diagram of one embodiment of an equalizer control circuit that enables secondary bit line equalizing.

FIG. 5 illustrates one example embodiment of an equalize control logic 500 that includes a precharge/equalize driver 510 and the secondary equalize driver 210 (also shown in FIG. 3). The precharge/equalize driver 510 generates the recovery signal blrec that controls the precharge/equalize circuit 160 (see FIG. 4). The precharge/equalize driver 510 inputs a read enable signal and a write enable signal and performs a logical OR operation 520 on the signals. The output of the OR operation 520 is input to an AND operation 530 with a clock signal that is active after a read or write evaluation period. The inverse of the output of the AND operation 530 is the recovery signal blrec. The blrec signal is a write enable signal or a read enable signal that is allowed to pass when the clock signal is active. Thus, blrec is generated when either the read or write enable signal is present and after an evaluation period.

The trigger signal blrec_2 that controls the secondary bit line equalize switch 230 (FIG. 4) is generated by the secondary bit line equalize driver 220.

The secondary bit line equalize driver 220 performs an AND operation 540 on the clock and the write enable signal. The inverse of the output of the AND operation 540 is the trigger signal blrec_2. The blrec_2 signal is a write enable signal that is allowed to pass when the clock signal is active. Thus, the secondary equalize driver 210 generates the trigger signal only after a write operation and not after a read operation. Since a read operation does not fully charge/discharge the bit lines, the secondary bit line equalize switch 220 is unnecessary. By switching the secondary bit line switch 220 only after write operations, power is saved.

Figure 6:
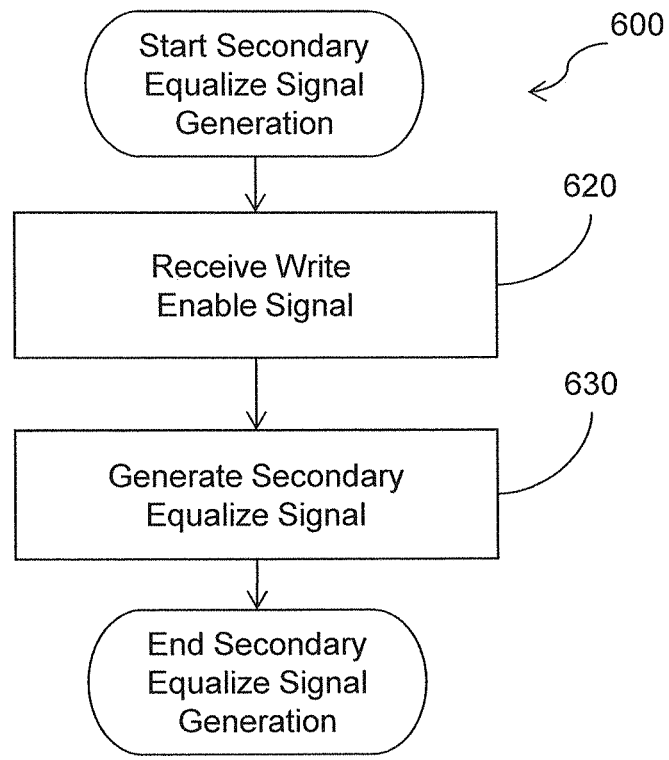
FIG. 6 illustrates one embodiment of a method associated with secondary bit line equalizing.

FIG. 6 illustrates one embodiment of a method 600 that generates a secondary equalize trigger signal. The method includes, at 620, receiving a write enable signal for a column of memory cells connected between a bit line and a complementary bit line. At 630 the method includes in response to receiving the write enable signal, electrically connecting the bit line to the complementary bit line.

Figure 7:
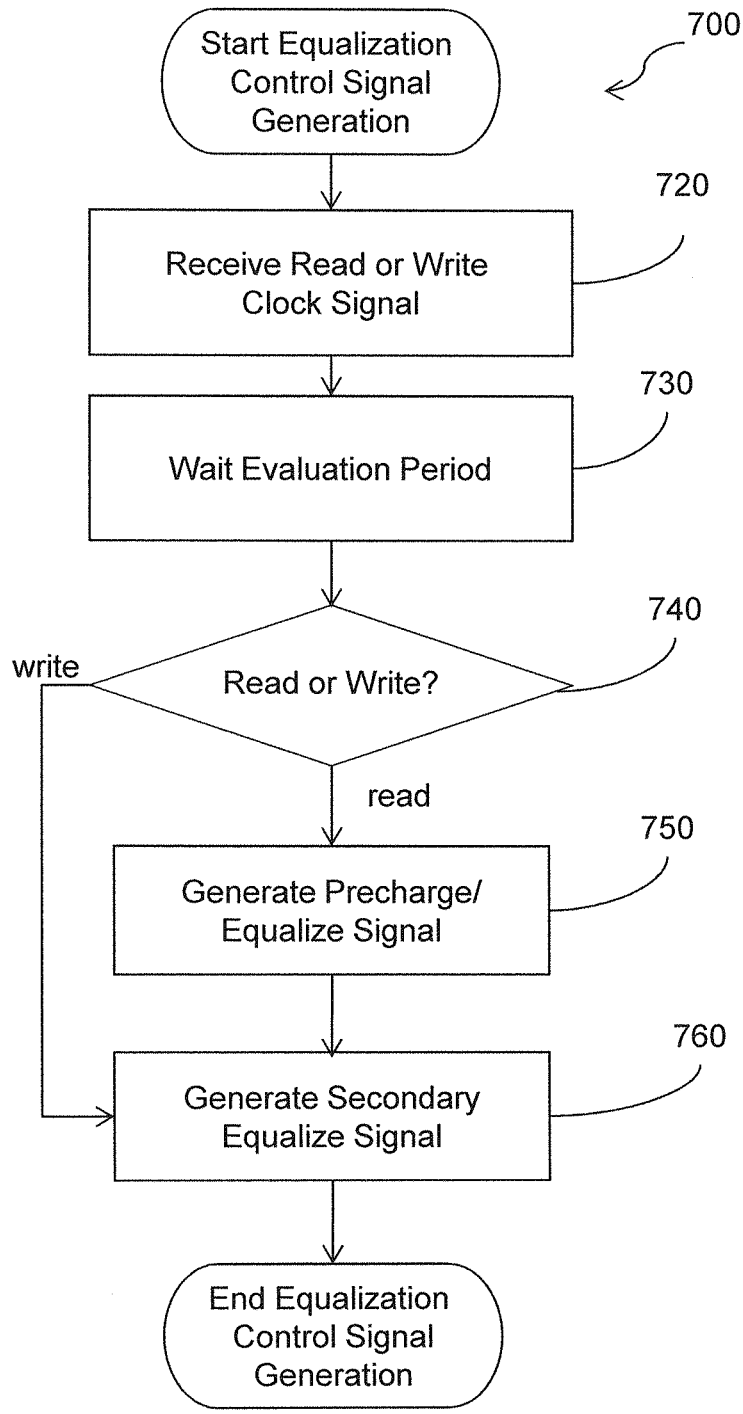
FIG. 7 illustrates one embodiment of a method associated with secondary bit line equalizing.

FIG. 7 illustrates one embodiment of a method 700 that generates equalization control signals. The method includes, at 720, receiving a read enable signal or a write enable signal for a column of memory cells connected between a bit line and a complementary bit line. At 730, the method includes waiting an evaluation period. At 740 the method determines whether a read enable signal or a write enable signal was received. If a write enable signal was received, a secondary equalize signal (e.g., blrec_2) is generated at 760. If a read enable signal was received, at 750 a precharge/equalize signal (e.g., blrec) is generated and a secondary equalize signal (e.g., blrec_2) is generated at 760.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated.

The following includes definitions of selected terms employed herein.

The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, a non-transitory computer readable medium that stores instructions, instructions in execution on a machine, and/or combinations of each to perform a function(s) or an action(s), and/or to cause a function or action from another logic, method, and/or system. Logic may include a microprocessor controlled by an algorithm, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is used herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be used.

What is claimed is:

1. A memory, comprising:
   a bit line;
   a complementary bit line;
   a column of memory cells, wherein each memory cell is electrically connected to the bit line and the complementary bit line;
   a first circuit connected between the bit line and the complementary bit line proximate a first end of the column of memory cells, wherein the first circuit is enabled by a first signal to electrically connect the bit line and the complementary bit line;
   a second circuit connected between the bit line and the complementary bit line proximate a second end of the column of memory cells that is opposite the first end, wherein the second circuit is enabled by a second signal to electrically connect the bit line and the complementary bit line; and
   wherein the first signal and the second signal are generated based on a write enable signal that is provided to the column of memory cells when a write operation is performed on a memory cell in the column, such that during a time period following a write operation, both the first circuit and the second circuit connect the bit line to the complementary bit line.

2. The memory of claim 1, wherein the first signal is different from the second signal.

3. The memory of claim 1, wherein the first signal is generated when either a read or write operation occurs on a memory cell in the column, and wherein the second signal is generated when a write operation occurs on a memory cell in the column, and wherein the second signal is not provided when a read operation occurs on a memory cell in the column.

4. The memory of claim 1, wherein the first signal is a logical NAND of a clock signal and an output of a logical OR of the read enable signal and the write enable signal.

5. The memory of claim 1, wherein the first signal is a write enable signal or a read enable signal that is allowed to pass when a clock signal is active.

6. The memory of claim 1, wherein the second signal is a logical NAND of a clock signal and the write enable signal.

7. The memory of claim 1, wherein the second signal is a write enable signal that is allowed to pass when a clock signal is active.

8. The memory of claim 1, where the first circuit comprises:
a precharge portion that includes:
a first PMOS transistor having a first gate connected to a first signal line that carries the first signal, a first source connected to the bit line, and a first drain connected to a second source of a second PMOS transistor; and
wherein the second PMOS transistor has a second gate connected to the first signal line and a second drain connected to the complementary bit line; and
an equalization portion that includes a third PMOS transistor having a third gate connected to the first signal line, a third source connected to the bit line, and a third drain connected to the complementary bit line.

9. The memory of claim 1, wherein the second circuit comprises a fourth PMOS transistor having a fourth gate connected to a second signal line that carries the second signal, a fourth source connected to the bit line, and a fourth drain connected to the complementary bit line.

10. An equalizer, comprising:
a secondary equalizer switch connected between a bit line and a complementary bit line, wherein the secondary equalizer switch is configured to electrically connect the bit line to the complementary bit line in response to a trigger signal;
a secondary equalizer driver electrically connected to the secondary equalizer switch, wherein the secondary equalizer driver is configured to provide the trigger signal in response to a write operation occurring on a bit line or the complementary bit line, and further wherein the secondary equalizer driver is configured to not provide the trigger signal in response to a read operation occurring on a bit line or the complementary bit line.

11. The equalizer of claim 10, wherein the secondary equalizer switch comprises a PMOS transistor having a drain electrically connected to the bit line, a source electrically connected to the complementary bit line, and a gate connected to the secondary equalizer driver.

12. The equalizer of claim 10, wherein:
the bit line and the complementary bit line are connected to a column of memory cells having a primary bit line equalizer connected between the bit line and the complementary bit line proximate a first end of the column of memory cells;
the secondary equalizer switch is positioned between the bit line and the complementary bit line proximate a second end of the column of memory cells opposite the first end with respect to the column of memory cells.

13. The equalizer of claim 12, wherein the trigger signal is different from a primary trigger signal that controls the primary bit line equalizer.

14. The equalizer of claim 10, wherein the trigger signal is a logical NAND of a clock signal and a write enable signal.

15. The equalizer of claim 10, wherein the trigger signal is a write enable signal that is allowed to pass when a clock signal is active.

16. A method, comprising:
receiving a write enable signal for a column of memory cells connected between a bit line and a complementary bit line; and
in response to receiving the write enable signal, electrically connecting the bit line to the complementary bit line, with a first circuit and a second circuit such that both circuits connect the bit line and the complementary bit line during a common time period.

17. The method of claim 16, further comprising:
receiving a read enable signal for the column of memory cells; and
in response to receiving the read enable signal, electrically connecting the bit line to the complementary bit line with the first circuit but not the second circuit.

18. The method of claim 16, wherein electrically connecting comprises causing a PMOS transistor to operate in a conducting state.

19. The method of claim 16, further comprising waiting an evaluation period after receiving the write enable signal before electrically connecting the bit line to the complementary bit line.

* * * * *